(12) United States Patent
Venkataramanan et al.

(10) Patent No.: US 8,787,058 B2
(45) Date of Patent: Jul. 22, 2014

(54) SELECTABLE MULTI-WAY COMPARATOR

(75) Inventors: Ganesh Venkataramanan, Sunnyvale, CA (US); Michael G. Butler, San Jose, CA (US); James Vinh, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 337 days.

(21) Appl. No.: 13/207,749

(22) Filed: Aug. 11, 2011

(65) Prior Publication Data
US 2013/0039109 A1 Feb. 14, 2013

(51) Int. Cl.
*G11C 15/00* (2006.01)
(52) U.S. Cl.
USPC .................................. 365/49.11; 365/49.17
(58) Field of Classification Search
CPC .............. G06F 17/30982; G11C 15/00–15/06
USPC ................................ 365/49.1–49.18; 711/108
See application file for complete search history.

(56) References Cited

U.S. PATENT DOCUMENTS

| | | | |
|---|---|---|---|
| 6,266,263 B1 * | 7/2001 | Lien et al. ................... | 365/49.17 |
| 6,480,406 B1 * | 11/2002 | Jin et al. ....................... | 365/49.1 |
| 6,845,024 B1 * | 1/2005 | Wanzakhade et al. ...... | 365/49.18 |
| 6,906,937 B1 * | 6/2005 | Nataraj ........................ | 365/49.1 |
| 2012/0110256 A1 * | 5/2012 | Venkataramanan et al. .. | 711/108 |

* cited by examiner

*Primary Examiner* — Tuan T Nguyen
*Assistant Examiner* — Khamdan Alrobaie
(74) *Attorney, Agent, or Firm* — Volpe and Koenig, P.C.

(57) ABSTRACT

A method for comparing content addressable memory (CAM) elements is disclosed. Binary values are stored in a pair of CAM elements. A comparison value is provided to a group of comparators, the comparison value based on the binary value stored in the pair of CAM elements. A match value is provided to the group of comparators, the match value corresponding to a binary value pair to be compared with the binary value stored in the pair of CAM elements. A positive match result value is output from a selected group of comparators via an output line in response to the comparison value matching the match value.

12 Claims, 7 Drawing Sheets

US 8,787,058 B2

SELECTABLE MULTI-WAY COMPARATOR

FIELD OF INVENTION

The present invention is generally directed to integrated circuits and in particular, to integrated circuits having content-addressable memory (CAM) and related methods.

BACKGROUND

Integrated circuits that include Content-Addressable Memories (CAMs) are well known in the art. CAM circuitry compares input search data against data stored in CAM arrays and identifies whether or not the input data matches the data stored in one or more of the memory arrays.

SUMMARY OF EMBODIMENTS OF THE INVENTION

Content-addressable memory (CAM) arrays and related circuitry for integrated circuits (ICs) and CAM array comparison methods are provided such that relatively low power is used in the operation of the CAM circuitry.

The CAM circuitry is configured to compare input search data against data stored in CAM arrays and to identify whether or not the input data matches the data stored in one or more of the arrays. The CAM circuitry is configured with logic circuitry that matches pairs of array data bits against representations of pairs of input data bits. The array data bit pairs and input data bit pairs define binary data pairs that are preferably mapped to a set of four binary vectors corresponding to (0001), (0010), (0100), and (1000). The comparison is preferably conducted such that significant power is used only when the respective binary data pairs match.

BRIEF DESCRIPTION OF THE DRAWINGS

A more detailed understanding may be had from the following description, given by way of example in conjunction with the accompanying drawings, wherein.

DETAILED DESCRIPTION

Figure 1:
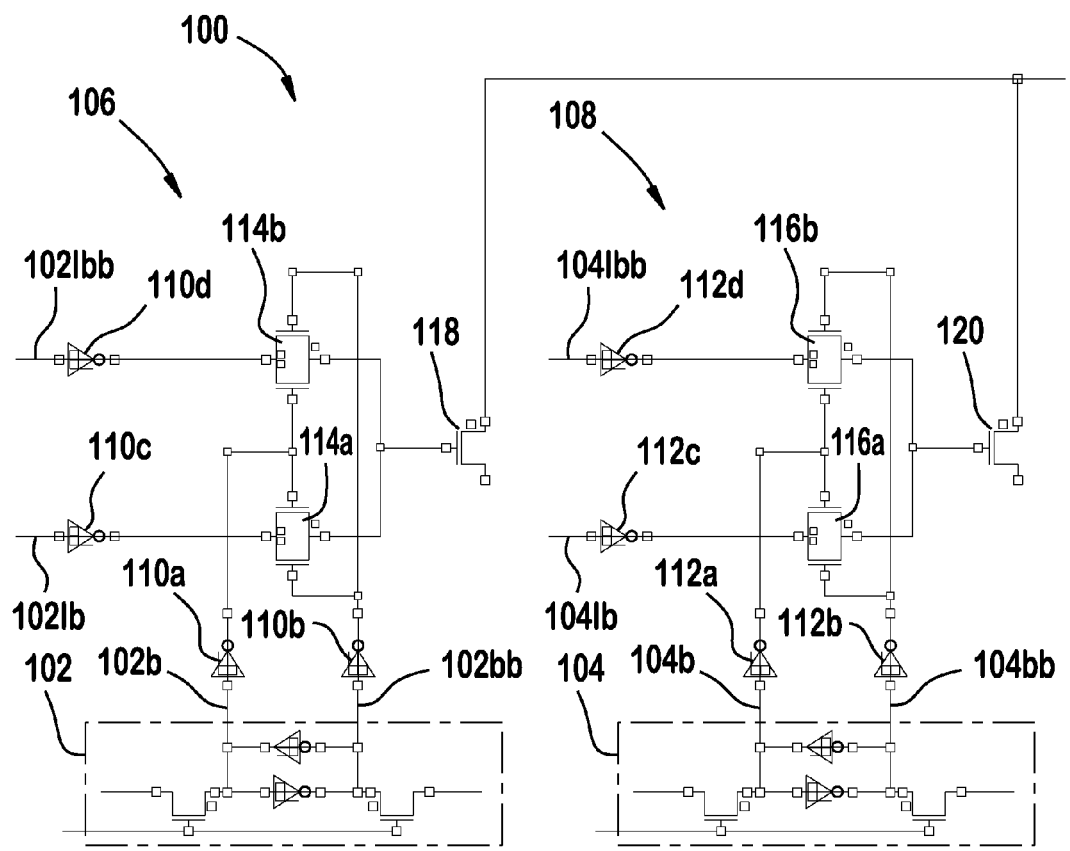
FIG. 1 is a circuit diagram of two memory elements of a CAM array that are configured for individual comparison for match or mismatch.

FIG. 1 shows a portion of a conventional "mismatch" content-addressable memory (CAM) circuit 100. The CAM circuit 100 includes two conventional memory elements 102, 104 of a CAM array from which extend bit and bit bar lines, 102*b*, 104*b* and 102*bb*, 104*bb*, respectively. Typically, the memory elements are static random access memory (SRAM) cells. Each memory element 102, 104 is respectively associated with bit and bit bar input lines, 102Ib, 104Ib and 102Ibb, 104Ibb, via a CAM comparison circuit 106, 108. The respective input lines 102Ib, 102Ibb and 104Ib, 104Ibb input data that is compared by the respective comparison circuit 106, 108 with the content of the respective memory cell 102, 104.

For each memory element 102, 104, the respective CAM comparison circuit 106, 108, includes four inverters 110*a-d*, 112*a-d*, first and second CMOS (complementary metal-oxide-semiconductor) transmission gates 114*a-b*, 116*a-b* and an NMOS (n-channel enhancement-type metal-oxide-semiconductor field-effect) transistor 118, 120, respectively.

One inverter 110*a-d*, 112*a-d* is associated with each of the bit and bit bar lines 102*b*, 102*bb*, 102Ib, 102Ibb, 104*b*, 104*bb*, 104Ib, 104Ibb that are coupled to the respective CAM comparison circuits 106, 108 to provide circuit isolation. The CMOS transmission gates 114*a-b*, 116*a-b* of each respective CAM comparison circuit 106, 108 are coupled to the bit and bit bar lines, 102*b*, 102*bb*, 104*b*, 104*bb*, of the respective memory element 102, 104 in a manner to control the first gate 114*a*, 116*a* to be an opposite state than the second gate 114*b*, 116*b*. Whether the first gate 114*a*, 116*a* is open and the second gate 114*b*, 116*b* is closed or whether the first gate 114*a*, 116*a* is closed and the second gate 114*b*, 116*b* is open is dependent upon the value stored in the respective memory element 102, 104.

The first CMOS transmission gate 114*a*, 116*a* of each respective CAM comparison circuit 106, 108 is coupled to the bit input line 102Ib, 104Ib, associated with the respective memory element 102, 104 to enable a control signal to pass to the respective NMOS transistor 118, 120 when the first CMOS transmission gate 114*a*, 116*a* is open. The first CMOS transmission gate 114*a*, 116*a* also prevents a control signal from passing to the respective NMOS transistor 118, 120 when the first CMOS transmission gate 114*a*, 116*a* is closed.

The second CMOS transmission gate 114*b*, 116*b* of each respective CAM comparison circuit 106, 108 is coupled to the bit bar input line 102Ibb, 104Ibb, associated with the respective memory element 102, 104 to enable a control signal to pass to the respective NMOS transistor 118, 120 when the second CMOS transmission gate 114*b*, 116*b* is open. The second CMOS transmission gate 114*b*, 116*b* also prevents a control signal from passing to the respective NMOS transistor 118, 120 when the second CMOS transmission gate 114*b*, 116*b* is closed.

When a "0" is stored in one of the memory elements 102, 104, the bit line 102*b*, 104*b* is "low" ("0") and the bit bar line 102*bb*, 104*bb* is "high" ("1"). When a "1" is stored in one of the memory elements 102, 104, the bit line 102*b*, 104*b* is "high" ("1") and the bit bar line 102*bb*, 104*bb* is "low" ("0"). When a comparison is to be made, if the input value for comparison is "0," the bit input line 102Ib, 104Ib is set "low" ("0") and the bit bar input line 102Ibb, 104Ibb is set "high" ("1"). If the input value for comparison is "1," the bit bar input line 102Ibb, 104Ibb is set "low" ("0") and the bit input line 102Ib, 104Ib is set "high" ("1").

The input line settings are inverted by passing through the inverters 110*c*, 110*d*, 112*c*, 112*d* to reach the CMOS transmission gates 114*a-b*, 116*a-b*, so that a "low" ("0") setting on an input line serves as a control signal at the respective CMOS transmission gate 114*a-b*, 116*a-b*, if the gate is open for it to pass to the NMOS transistor 118, 120. A "high" ("1") setting on an input line is inverted when it reaches the respective CMOS transmission gate 114*a-b*, 116*a-b*, so a "high" ("1") setting on an input line does not serve as a control signal for the respective NMOS transistor 118, 120 even if the gate is open.

The respective CAM comparison circuits 106, 108 operate such that a control signal is passed to operate the NMOS transistors 118, 120 to send a mismatch signal when either or both of the memory elements 102, 104 do not match the respective input values. The NMOS transistors 118, 120 of the CAM comparison circuits 106, 108 are coupled to each other and to similar NMOS transistors of other CAM comparison circuits (not shown) within a CAM array such that a mismatch indication for the CAM array is provided if any of the NMOS transistors sends a mismatch signal. A CAM array match indication will only be provided for a given comparison if no mismatch signal is sent by the NMOS transistors of the CAM comparison circuits within the CAM array.

Where a value of "0" is stored in the memory element 102, the CMOS transmission gate 114a will be closed and the CMOS transmission gate 114b will be open. Thus, if the input value for comparison is "0," the "low" ("0") on the bit input line 102Ib will not cause the NMOS transistor 118 to operate, because the transmission gate 114a is closed. But if the input value for comparison is "1," the "low" ("0") on the bit bar input line 102Ibb will cause the NMOS transistor 118 to operate to send a mismatch signal, because the transmission gate 114b is open.

Where a value of "1" is stored in the memory element 102, the CMOS transmission gate 114a will be open and the CMOS transmission gate 114b will be closed. Thus, if the input value for comparison is "1," the "low" ("0") on the bit bar input line 102Ibb will not cause the NMOS transistor 118 to operate, because the transmission gate 114b is closed. But if the input value for comparison is "0," the "low" ("0") on the bit input line 102Ib will cause the NMOS transistor 118 to operate to send a mismatch signal, because the transmission gate 114a is open.

Where a value of "0" is stored in the memory element 104, the CMOS transmission gate 116a will be closed and the CMOS transmission gate 116b will be open. Thus, if the input value for comparison is "0," the "low" ("0") on the bit input line 104Ib will not cause the NMOS transistor 120 to operate, because the transmission gate 116a is closed. But if the input value for comparison is "1," the "low" ("0") on the bit bar input line 104Ibb will cause the NMOS transistor 120 to operate to send a mismatch signal, because the transmission gate 116b is open.

Where a value of "1" is stored in the memory element 104, the CMOS transmission gate 116a will be open and the CMOS transmission gate 116b will be closed. Thus, if the input value for comparison is "1," the "low" ("0") on the bit bar input line 104Ibb will not cause the NMOS transistor 120 to operate, because the transmission gate 116b is closed. But if the input value for comparison is "0," the "low" ("0") on the bit input line 104Ib will cause the NMOS transistor 120 to operate to send a mismatch signal, because the transmission gate 116a is open.

Each time a comparison is made that does not match the pair of values stored in the two memory elements 102, 104, at least one of the NMOS transistors 118, 120 is operated to send a mismatch signal. This results in a significant amount of power being used, as compared to when a comparison is made and both memory values match.

Figure 2:
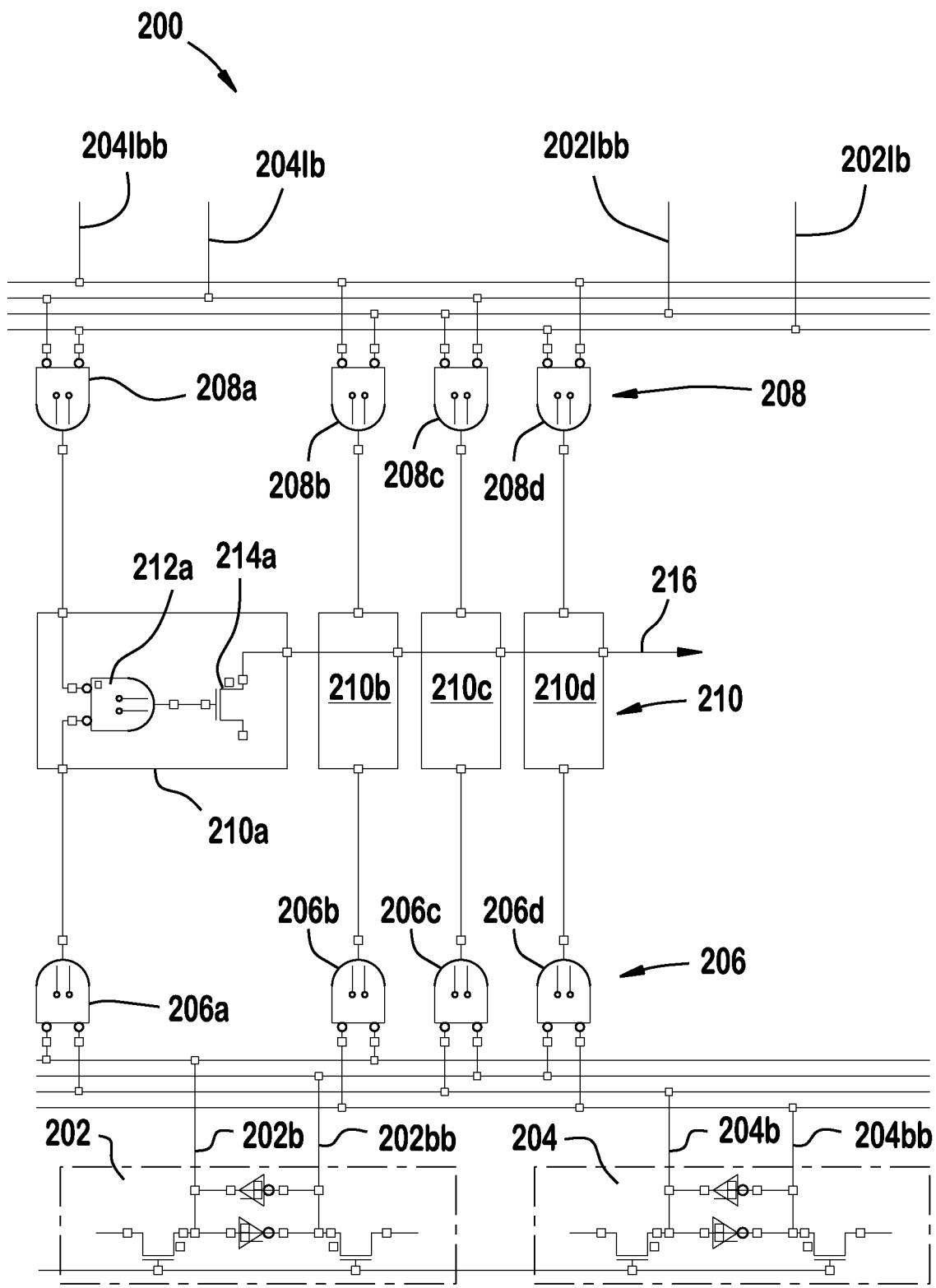
FIG. 2 is a circuit diagram of two memory elements of a CAM array that are configured for a paired comparison for match or mismatch.

FIG. 2 shows a first example of a "match" CAM circuit 200. The match CAM circuit 200 includes a pair of memory elements 202, 204 of a CAM array. Preferably, the memory elements 202, 204 are static random access memory (SRAM) cells. The match CAM circuit 200 includes decoder circuitry 206, input encoder circuitry 208, and comparator circuitry 210.

The decoder circuitry 206 is configured to provide a comparison signal to the comparator circuitry 210 that uniquely represents a binary value pair stored in the memory elements 202, 204. The input encoder circuitry 208 is configured to input a match signal to the comparator circuitry 210 that uniquely represents a binary value pair to be compared with the stored binary value pair. The comparator circuitry 210 is configured to operate a transistor to output a positive match result signal only if the comparison signal provided to the comparator circuitry 210 and the match signal input to the comparator circuitry 210 represent the same binary value pair.

No transistor of the comparator circuitry 210 is operated when the comparison signal provided to the comparator circuitry 210 and the match signal input to the comparator circuitry 210 represent different binary value pairs. This results in operational power savings over existing CAM circuits where an NMOS transistor is operated each time a mismatch of any single value occurs. The NMOS transistors 118, 120 of mismatch CAM circuit 100 of FIG. 1 will operate to send a mismatch signal once where there is one mismatch and twice where both memory elements mismatch. Thus, the power usage is statistically four times greater than the match CAM circuit 200.

For example, for the match CAM circuit 200 of FIG. 2, for a stored binary value pair of (0,0), there is one NMOS transistor operation when a representation of the binary value (0,0) is input and no NMOS transistor operation when any other value pair is input. But for the mismatch CAM circuit 100 of FIG. 1, for a stored binary value pair of (0,0), there is no NMOS transistor operation when a representation of the binary value (0,0) is input, but one NMOS transistor operation when either (0,1) or (1,0) is input and two NMOS transistor operations when (1,1) is input.

In context, this power savings can become significant. A typical CAM array comparison operation may be conducted in less than one clock cycle and may be made for multiple CAM arrays for nearly every clock cycle of operation of a processor when it is executing instructions and operations. Accordingly, the effect of even a small power savings during a CAM comparison of a pair of memory elements is dramatically multiplied when considering the number of CAM pair comparisons made during processor operation. For example, a core processor scheduler that operates between 2-4 GHz and having a 40 position queue with four wake up CAMs per queue position, i.e., 160 wake up cams, each having four memory element pairs, i.e., 640 memory element pairs, there will be over one trillion memory element pair comparisons made during a typical second of core processor operation with respect to the wake up CAMs.

Referring back to FIG. 2, a pair of bit and bit bar lines, 202b, 204b and 202bb, 204bb extend from each memory element 202, 204, respectively. The pair of memory elements 202, 204 are associated with a pair of input lines, each defined by bit and bit bar input lines 202Ib, 202Ibb and 204Ib, 204Ibb, via the match CAM circuit 200. When a representation of a binary value pair is input via the bit and bit bar input lines, a match result indication is output if the input binary value pair representation matches the binary value pair stored in the pair of memory elements 202, 204.

The bit and bit bar lines, 202b, 204b and 202bb, 204bb of the pair of memory elements 202, 204 are coupled to the AND gates 206a-d of the decoder circuit 206. The decoder AND gates 206a-d preferably include input inverters to provide circuit isolation between the pair of memory elements 202, 204 and the decoder circuit 206. Outputs of the four decoder AND gates 206a-d define four comparison lines that are respectively coupled to comparators 210a-d of the comparator circuit 210.

The bit and bit bar input 202Ib, 204Ib and 202Ibb, 204Ibb of the pair of input lines are coupled to the AND gates 208a-d of the encoder circuit 208. The encoder AND gates 208a-d preferably include input inverters to provide circuit isolation between the input lines and the encoder circuit 208. Outputs of the four encoder AND gates 208a-d define four match lines that are respectively coupled to the comparators 210a-d.

As only shown for the comparator circuit 210a, the comparators 210a-d each include an AND gate 212a that has inputs coupled to the comparison line of the respective decoder AND gate 206a and to the match line of the respective encoder AND gate 208a. The comparator AND gate 212a has an output coupled to control the operation of an NMOS transistor 214a that is configured to output a positive match value signal when it is operated.

Each comparator 210a-d may include an NMOS transistor 214a that outputs the positive match value signal to a common output line 216 of comparator circuit 210 when it is operated. Alternatively, in lieu of each comparator 210a-d having an NMOS transistor, the outputs of the comparator AND gates may be coupled, preferably via a logical OR coupling, to a single NMOS transistor that outputs the positive match value signal from the comparator circuit 210 (not shown). Where the outputs of the comparator AND gates are coupled via a logical OR coupling, in some applications, it may be possible to eliminate the NMOS transistor and output the result of the logical OR coupling to indicate whether or not there is a match.

The decoder circuit 206 is configured to produce a comparison value on one of the comparison lines for any given binary value pair stored in the pair of memory elements 202, 204. Similarly, the encoder circuit 208 is configured to produce a match value on one of the match lines for any given binary value pair to be compared.

The comparator circuits 210a-d are configured to generate a positive match result value from one of the comparator AND gates if the comparison line for that circuit has been provided with the comparison value and the match line for that circuit has been provided with the match value. Generating the positive match result value from one of the comparator AND gates causes the NMOS transistor associated with the AND gate to output a positive match value signal.

As explained below, the output of a positive match result value from a comparator AND gate will only occur for one of the comparators when the pair of values stored in the pair of memory elements 202, 204 matches the represented binary value pair that is input. Otherwise, the NMOS transistors 214a of the comparator circuits 210a-d will not be operated.

When a "0" is stored in one of the memory elements 202, 204, the bit line 202b, 204b is "low" ("0") and the bit bar line 202bb, 204bb is "high" ("1"). When a "1" is stored in one of the memory elements 202, 204, the bit line 202b, 204b is "high" ("1") and the bit bar line 202bb, 204bb is "low" ("0"). As a result, the stored values of the pair of memory elements 202, 204 is decoded into one of four vectors (1,0,0,0), (0,1,0,0), (0,0,1,0) or (0,0,0,1) that is output on the four comparison lines from the decoder AND gates 206a-d.

For example, when a (0,0) binary value pair is stored in the pair of memory elements 202, 204, the bit lines 202b, 204b are both "low" ("0") and the bit bar lines 202bb, 204bb are both "high" ("1"). As a result, "0"s are input to both inverter inputs of the decoder AND gate 206a resulting in an output value "1" and at least one "1" is input to one of the inverter inputs of the other three decoder AND gates 206b-d, resulting in an output value "0." Thus, the stored value (0,0) in the pair of memory elements 202, 204, is decoded into the vector (1,0,0,0) being output on the four comparison lines from the decoder AND gates 206a-d. Accordingly, for the stored value (0,0), the decoder AND gate 206a produces a "1" that serves as the comparison value input to the comparator AND gate 212a which effectively enables the comparator 210a to make a comparison with a match value. The decoder AND gates 206b-d all produce a "0" that does not enable any of the other comparators 210b-d to make comparisons.

When the representation of a binary value pair is input for comparison, "0" is represented by the bit input line 202Ib, 204Ib set as "low" ("0") and the bit bar input line 202Ibb, 204Ibb set as "high" ("1") and a "1" is represented by the bit input line 202Ib, 204Ib set as "high" ("1") and the bit bar input line 202Ibb, 204Ibb set as "low" ("0"). As a result, the input binary value pairs are encoded into one of four vectors (1,0,0,0), (0,1,0,0), (0,0,1,0) or (0,0,0,1) that is output on the four match lines from the encoder AND gates 208a-d.

For example, when the binary value pair (0,0) is to be compared to a stored binary value pair, the bit input lines 202Ib, 204Ib are both "low" ("0") and the bit bar input lines 202Ibb, 204Ibb are both "high" ("1"). As a result, "0"s are input to both inverter inputs of the encoder AND gate 208a resulting in an output value "1" and at least one "1" is input to one of the inverter inputs of the other three encoder AND gates 208b-d resulting in an output value "0." Thus, the binary value pair (0,0) is encoded into the vector (1,0,0,0) that is output on the four match lines from the respective encoder AND gates 208a-d. Accordingly, for the binary value pair (0,0), the encoder AND gate 208a produces a "1" that serves as the match value input to the comparator AND gate 212a, which effectively enables the comparator 210a to make a comparison. The encoder AND gates 208b-d all produce a "0," so that if one of the other comparators 210b-d is enabled by being provided with the comparison value, no positive match value is generated by the other comparators' AND gate.

For any binary value pair other than (0,0), the encoder AND gate 208a produces a "0" that does not serve as the match value input to the comparator AND gate 212a and prevents the generation of a positive match value by the AND gate 212a. Thus, only when the stored binary value pair is (0,0) and the binary value pair to be compared is also (0,0) will a positive match value be generated by the comparator AND gate 212a. Similarly, only when the stored binary value pair is (0,1) and the binary value pair to be compared is also (0,1) will a positive match value be generated by the AND gate of comparator 210b; only when the stored binary value pair is (1,0) and the binary value pair to be compared is also (1,0) will a positive match value be generated by the AND gate of comparator 210c; and only when the stored binary value pair is (1,1) and the binary value pair to be compared is also (1,1) will a positive match value be generated by the AND gate of comparator 210d.

Figure 3A:
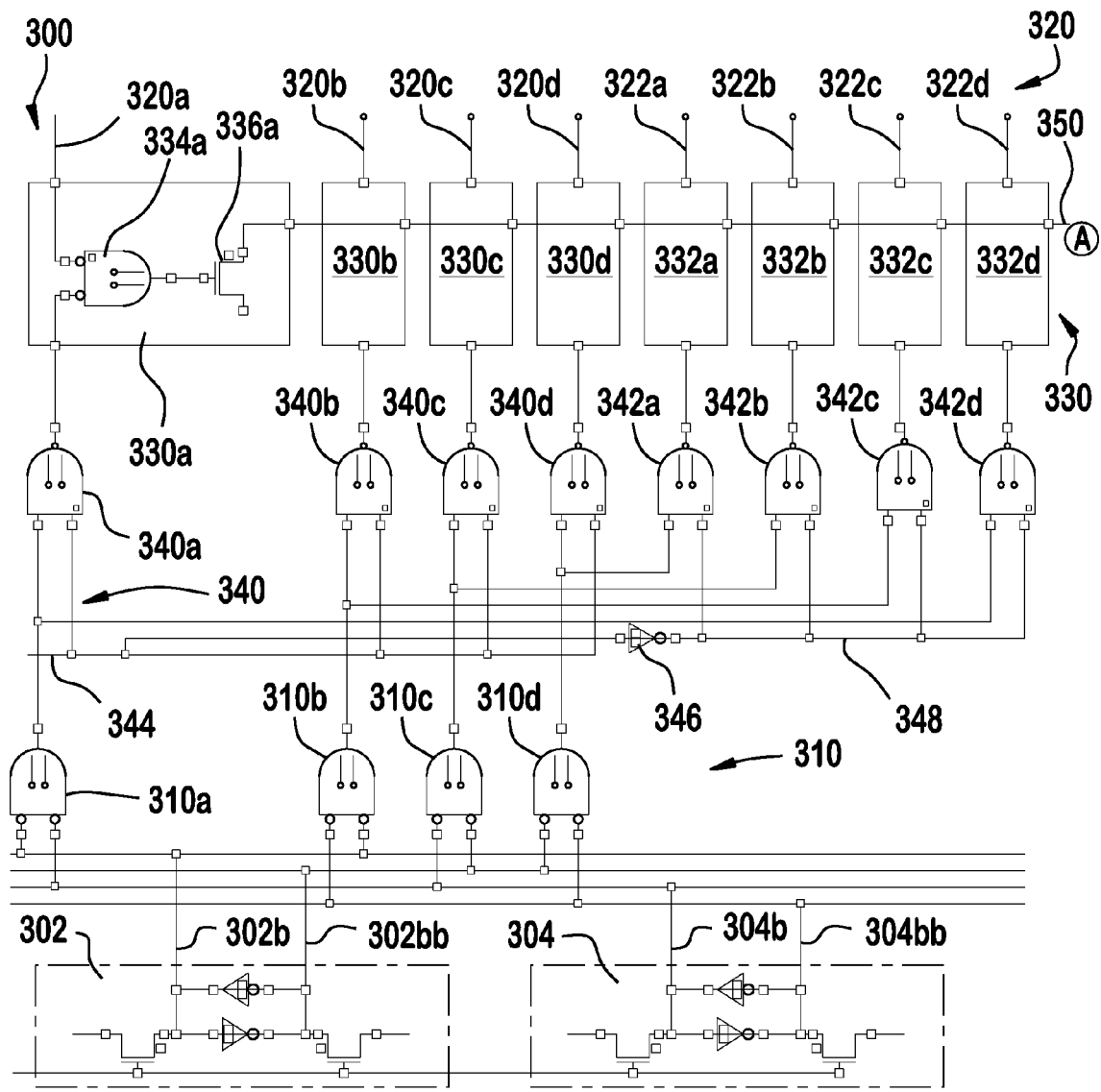
FIGS. 3A and 3B is a circuit diagram, in two parts, of a CAM array configured for paired match comparison.
Figure 3B:
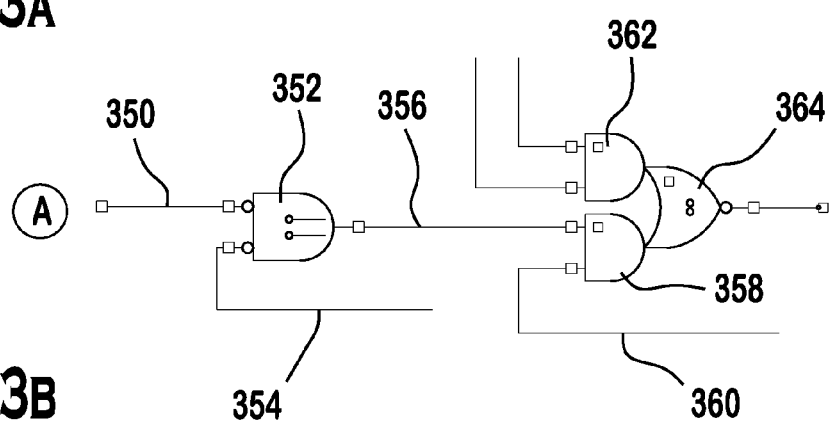

FIGS. 3A and 3B show a second example of a match CAM circuit 300. The match CAM circuit 300 continues from A of FIG. 3A to A of FIG. 3B and is illustrated in detail with respect to one pair of memory elements 302, 304 of a CAM array having eight elements, i.e., four pairs of array elements. The pair of memory elements 302, 304 is associated with decoder circuitry 310, encoded match lines 320, comparator circuitry 330, and multiplexor selection circuitry 340. Preferably, the memory elements 302, 304 are static random access memory (SRAM) cells.

The decoder circuitry 310 is configured to provide a comparison signal to the comparator circuitry 330 that uniquely represents a binary value pair stored in the memory elements 302, 304. The comparison signal is directed to one of two sets of comparators, 330a-d and 332a-d, of the comparator circuitry 330 via multiplexor selection circuitry 340.

The encoded match lines 320 are configured to input a match signal to the comparator circuitry 330 that uniquely represents a binary value pair to be compared with the stored binary value pair. The encoded match lines 320 are divided into two sets, 320a-d and 322a-d, which are coupled respectively to the two sets of comparators, 330a-d and 332a-d, of the comparison circuitry 330. A match signal may be input from either set of match lines 320a-d, 322a-d.

The comparator circuitry 330 is configured to operate a transistor to output a positive match result signal only if the comparison signal provided to a selected set of comparators 330a-d, 332a-d of the comparator circuitry 330 and a match signal input to the selected set of comparators 330a-d, 332a-d represent the same binary value pair.

No transistor of the comparator circuitry 330 is operated when the comparison signal provided to the selected set of comparators 330a-d, 332a-d and the match signal input to the selected set of comparators 330a-d, 332a-d represent different binary value pairs. This results in operational power savings over existing CAM circuits where an NMOS transistor is operated each time a mismatch of any single value occurs.

Referring to the details of FIG. 3A, a pair of bit and bit bar lines, 302b, 304b and 302bb, 304bb extend from each memory element 302, 304, respectively. The pair of memory elements 302, 304 are associated with the two sets of match lines 320a-d, 322a-d, via the match CAM circuit 300. When a representation of a binary value pair is input via one of the sets of match lines 320a-d, 322a-d to a corresponding selected set of comparators 330a-d, 332a-d, a match result indication is output if the input binary value pair representation matches the binary value pair stored in the pair of memory elements 302, 304.

The bit and bit bar lines, 302b, 304b and 302bb, 304bb, of the pair of memory elements 302, 304 are coupled to AND gates 310a-d of the decoder circuit 310. The decoder AND gates 310a-d preferably include input inverters to provide circuit isolation between the pair of memory elements 302, 304 and the decoder circuit 310. Outputs of the four decoder AND gates 310a-d define four comparison lines that are respectively coupled to a first set of comparators 330a-d of the comparator circuit 330 or a second set of comparators 332a-d of the comparator circuit 330, depending on a logical input to the multiplexor selection circuitry 340.

The multiplexor selection circuitry 340 includes a first set of selector AND gates 340a-d and a second set of selector AND gates 342a-d. Each selector AND gate includes an output inverter to provide circuit isolation between the multiplexor selection circuitry 340 and the comparator circuit 330 along with first and second inputs. The comparison line outputs of the four decoder AND gates 310a-d are each coupled to a first input of a respective selection AND gate of each of the two sets of selector AND gates 340a-d, 342a-d. An input line 344 of the multiplexor selection circuitry 340 is coupled to the second input of the first set of selector AND gates 340a-d and to the input of an inverter 346. An inverted input line 348 of the multiplexor selection circuitry 340 is coupled to the output of the inverter 346 and the second input of the second set of selector AND gates 342a-d.

When the input line 344 of the multiplexor selection circuitry 340 is set high ("1"), the first set of selector AND gates 340a-d can pass a comparison signal to a respective first set of comparators 330a-d and the second set of selector AND gates 342a-d block the passage of a comparison signal to any of the second set comparators 332a-d. Similarly, when the input line 344 of the multiplexor selection circuitry 340 is set low ("0"), the second set of selector AND gates 342a-d can pass a comparison signal to a respective second set of comparators 332a-d and the first set of selector AND gates 340a-d block the passage of a comparison signal to any of the second set of comparators 330a-d.

As only shown for comparator circuit 330a, the comparators 330a-d and 332a-d each include an AND gate 334a that has first and second inputs that each include an inverter to provide circuit isolation for the comparator circuit 330. A first input of the AND gate 334a is coupled to the comparison line of the respective decoder AND gate 310a via the selection AND gate 340a. Due to the output inverter of the selection AND gate 340a and the input inverter of the comparator AND gate 330a, the comparison value upon which the comparator AND gate 330a operates is logically the same as the output from the decoder AND gate 310a. The other comparator AND gates are similarly coupled to a respective decoder AND gate 310a-d via the respective selection AND gate 340b-d, 342a-d. The second input of the comparator AND gates are each coupled to the respective match lines 320a-d, 322a-d.

The comparator AND gates (such as 334a) of each comparator 330a-d, 332a-d has an output coupled to control the operation of an NMOS transistor (such as 336a) that is configured to output a positive match value signal to a common output line 350 of the comparator circuit 330 when it is operated. Alternatively, in lieu of each comparator 330a-d, 332a-d having an NMOS transistor, the outputs of the comparator AND gates may be coupled, preferably via a logical OR coupling, to a single NMOS transistor (not shown) that outputs the positive match value signal from the comparator circuit 330 to the comparator circuit output line 350.

As shown in FIG. 3B, the comparator circuit output line 350 is coupled to a first input of a decision AND gate 352. Preferably, the NMOS transistors output a logically inverted signal as the positive match value signal so that the decision AND gate 352 inputs include inverters for providing isolation to the comparator circuit 330. A second input of the decision AND gate 352 is coupled an output line 354 of a similar comparison circuit (not shown) associated with two other memory elements of the CAM array.

When both comparator circuit output lines 350, 354 provide positive match value signals, the decision AND gate 352 outputs a half array match value signal on line 356 to a first input of an array decision AND gate 358. A similar line 360 coupled to a second input of the array decision AND gate 358 provides the output from a decision AND gate with respect to corresponding circuitry associated with four other CAM array memory elements.

When both decision AND gate output lines 356, 360 provide half array match value signals, the array decision AND gate 358 outputs an array match value signal.

In one example embodiment, used in conjunction with a scheduler, the same CAM memory elements may be used for comparisons associated with two sets of pipeline registers, PRN0, PRN1. For example, the eight comparators 330a-d, 332a-d may be driven via eight inputs 320a-d, 322a-d from the first set of pipeline registers, PRN0, and by memory elements 302, 304 via the outputs of the eight gates 340a-d, 342a-d. A second set of eight comparators (not shown) may be respectively coupled the outputs of the eight gates 340a-d, 342a-d and a second set of eight inputs (not shown) may be provided. The second set of eight comparators (not shown) may be driven via the second set of eight inputs (not shown) by the second set of pipeline registers, PRN1, and by memory elements 302, 304 via the outputs of the eight gates 340a-d, 342*a-d*, to produce an output reflecting a comparison from PRN1 corresponding to the output 350 that would reflect a comparison from PRN0.

Such additional comparator and input sets may be provided for each of the four pairs of CAM memory elements of the eight-bit CAM and are coupled, in a manner corresponding to gate 352 and lines 354, 356 and 340, to an array decision AND gate 362. As a result, either the first set of pipeline registers, PRN0, can attempt to match the eight memory elements of the CAM by driving the circuit to have the array decision AND gate 358 output the array match value signal, or the second set of pipeline registers, PRN1, can attempt to match the eight memory elements of the CAM by driving the circuit to have the array decision AND gate 362 output the array match value signal. The outputs of the array decision AND gates 358, 362 are coupled to inputs of an OR gate 364 that outputs a signal reflecting a match with respect to the CAM from either set of pipeline registers, PRN0, PRN1.

In operation, the decoder circuit 354 produces a comparison value on one of the comparison lines for any given binary value pair stored in the pair of memory elements 302, 304. Similarly, the match lines 320 provide a match value on one of the match lines for any given binary value pair to be compared.

As explained below, the output of a positive match result value from a comparator AND gate will only occur for one of the comparators when the values stored in the pair of memory elements 302, 304 matches the represented binary value pair that is input to the selected set of comparator circuits 330*a-d* or 332*a-d*. Otherwise, the NMOS transistors 336*a* of the comparator circuits 330*a-d*, 332*a-d* will not be operated.

When a "0" is stored in one of the memory elements 302, 304, the bit line 302*b*, 304*b* is "low" ("0") and the bit bar line 302*bb*, 304*bb* is "high" ("1"). When a "1" is stored in one of the memory elements 302, 304, the bit line 302*b*, 304*b* is "high" ("1") and the bit bar line 302*bb*, 304*bb* is "low" ("0"). As a result, the stored values of the pair of memory elements 302, 304 are decoded into one of four vectors (1,0,0,0), (0,1,0,0), (0,0,1,0), or (0,0,0,1) that is output on the four comparison lines from the decoder AND gates 310*a-d*.

For example, when a (0,0) binary value pair is stored in the pair of memory elements 302, 304, the bit lines 302*b*, 304*b* are both "low" ("0") and the bit bar lines 302*bb*, 304*bb* are both "high" ("1"). As a result, "0"s are input to both inverter inputs of the decoder AND gate 310*a*, resulting in an output value "1" and at least one "1" is input to one of the inverter inputs of the other three decoder AND gates 310*b-d*, resulting in an output value "0." Thus, the stored value (0,0) in the pair of memory elements 302, 304 is decoded into the vector (1,0,0,0) being output on the four comparison lines from the decoder AND gates 310*a-d*. For the stored value (0,0), the decoder AND gate 310*a* produces the comparison value that is passed to the AND gate of the comparator circuit 330*a* or 332*a* selected by the multiplexor selection circuitry 340, which effectively enables the selected comparator 330*a* or 332*a* to make a comparison with a match value. In this case, the decoder AND gates 310*b-d* all produce a "0" that do not enable any of the comparators 330*b-d*, 332*b-d* to make comparisons, while the multiplexor selection circuitry 340 prevents enablement the comparators of the set of comparators that is not selected.

When the representation of a binary value pair is input for comparison to a selected set of comparators 330*a-d* or 332*a-d*, an encoded version of the binary value pair is provided on the respective set of match lines 320*a-d*, 322*a-d*. The encoded version of the binary value pair corresponds to one of four vectors (1,0,0,0), (0,1,0,0), (0,0,1,0), or (0,0,0,1), where a "1" corresponds to the match value. But an inverted version of those vectors is supplied due to the invertors associated with the inputs of the comparator AND gates to which the respective match lines are coupled, so that the match value is actually "0" from the match lines shown in FIG. 3A. Where no comparison is being made, the vector (0,0,0,0) may be input, that becomes inverted to (1,1,1,1), so no match value is provided from any of the match lines in that case.

For example, when the binary value pair (0,0) is to be compared to a stored binary value pair when the first set of comparators 330*a-d* is selected, the match line 320*a* provides a match value and the other three match lines 320*b-d* do not provide the match value. For the binary value pair (0,0), the match line 320*a* provides the requisite match value input to the comparator AND gate 334*a* which effectively enables the comparator 330*a* to make a comparison. None of the match lines 320*b-d* provide the match value, so that if one of the other comparators 330*b-d* is enabled by being provided with the comparison value, no positive match value is generated by the other comparators' AND gate.

For comparison against any binary value pair other than (0,0), the match line 320*a* does not provide the match value input to the comparator AND gate 334*a* and prevents the generation of a positive match value by the AND gate 334*a*. Thus, only when the stored binary value pair is (0,0) and the binary value pair to be compared is also (0,0) will a positive match value be generated by the comparator AND gate 334*a* when the first set of comparators 330*a-d* is selected. Similarly, only when the stored binary value pair is (0,1) and the binary value pair to be compared is also (0,1) will a positive match value be generated by the AND gate of comparator 330*b* when the first set of comparators 330*a-d* is selected; only when the stored binary value pair is (1,0) and the binary value pair to be compared is also (1,0) will a positive match value be generated by the AND gate of comparator 330*c* when the first set of comparators 330*a-d* is selected; and only when the stored binary value pair is (1,1) and the binary value pair to be compared is also (1,1) will a positive match value be generated by the AND gate of comparator 330*d* when the first set of comparators 330*a-d* is selected. Similarly, only when the stored binary value pair matches the binary value pair to be compared, will a positive match value be generated by one of the AND gates of the second set of comparators 332*a-d* when the second set of comparators 332*a-d* is selected by the multiplexor selection circuitry 340.

Figure 4:
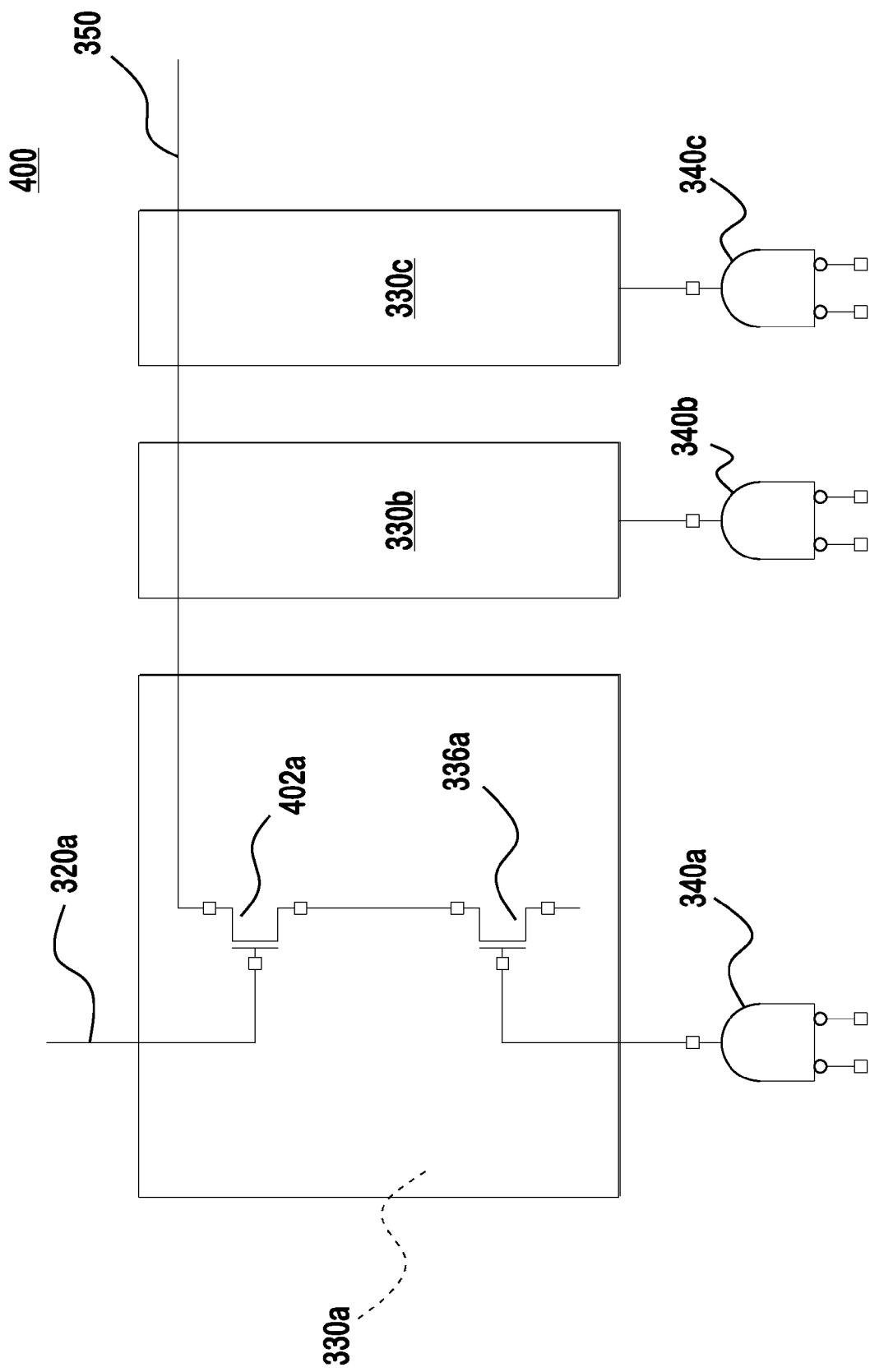
FIG. 4 is a circuit diagram showing a portion of a modified CAM array based on the CAM array shown in FIGS. 3A and 3B.

FIG. 4 shows a portion of a match CAM circuit 400. The match CAM circuit 400 is based on the match CAM circuit 300 shown in FIG. 3A and described above; like elements in FIG. 4 have been given like reference numerals.

The difference between the match CAM circuit 400 and the match CAM circuit 300 lies in the construction of the comparators 330*a-d* and 332*a-d*. For simplicity, only detail of comparator 330*a* is shown in FIG. 4. The comparator 330*a* includes two NMOS transistors 336*a*, 402*a* in series to perform the comparison between the memory location (via the selector AND gate 340*a*) and the input (via input line 320*a*). The result of the comparison is output onto output line 350.

The construction and operation of the remainder of the match CAM circuit 400 is the same as the match CAM circuit 300.

Figure 5:
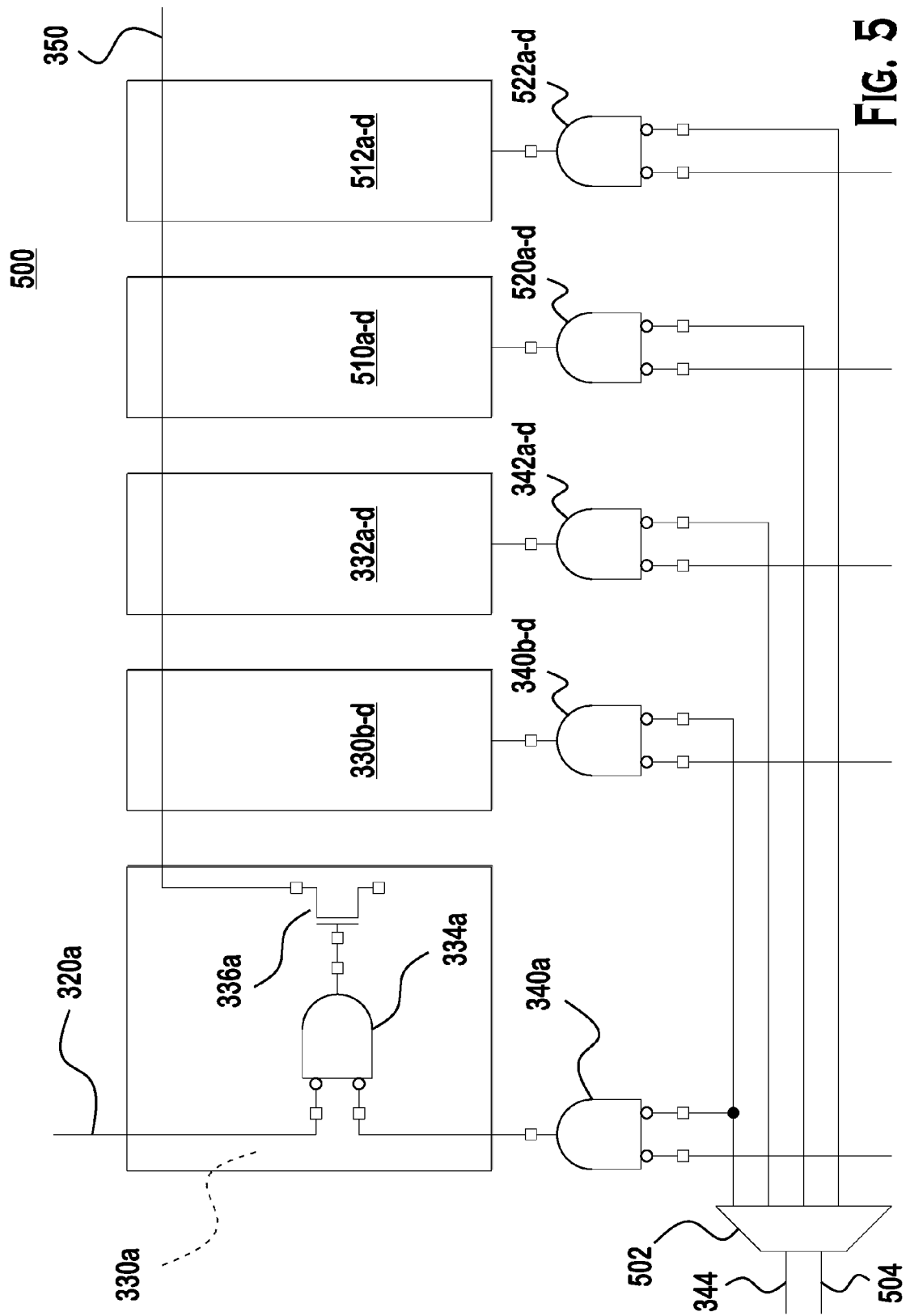
FIG. 5 is a circuit diagram showing a portion of another embodiment of a modified CAM array based on the CAM array shown in FIGS. 3A and 3B.

FIG. 5 shows a portion of a match CAM circuit 500. The match CAM circuit 500 is based on the match CAM circuit 300 shown in FIG. 3A and described above; like elements in FIG. 5 have been given like reference numerals.

In FIG. 3A, input line 344 acts like a multiplexor to select either selector AND gates 340*a-d* or selector AND gates 342*a-d*. As shown in FIG. 5, the multiplexor concept may be expanded by adding a multiplexor 502 to the match CAM circuit 500. For example, the multiplexor 502 may be a 2 to 4 decoder, as described below. The multiplexor 502 can logically be expanded to any higher number of inputs/outputs (for example, 4 to 16, 5 to 32, etc.). The match CAM circuit 500 will work regardless of the size of the multiplexor 502, because as long as only one out of any number of outputs is turned on, this structure will work.

The multiplexor 502 receives two input lines 344 and 504, which are decoded to select a comparator to use, from among comparators 330a-d, 332a-d, 510a-d, and 512a-d. Similar to the match CAM circuit 300, the match CAM circuit 500 supplies a memory value input to the comparators 330a-d, 332a-d, 510a-d, and 512a-d via selector AND gates 340a-d, 342a-d, 520a-d, and 522a-d. The output of the multiplexor 502 provides a "1" value to the desired set of comparators and provides a "0" value to the other sets of comparators, effectively disabling their outputs.

The construction and operation of the remainder of the match CAM circuit 500 is the same as the match CAM circuit 300.

The match CAM circuit 500 may be further modified (not shown) to use the two NMOS transistor arrangement shown in FIG. 4 instead of the comparator AND gate 334a.

Figure 6:
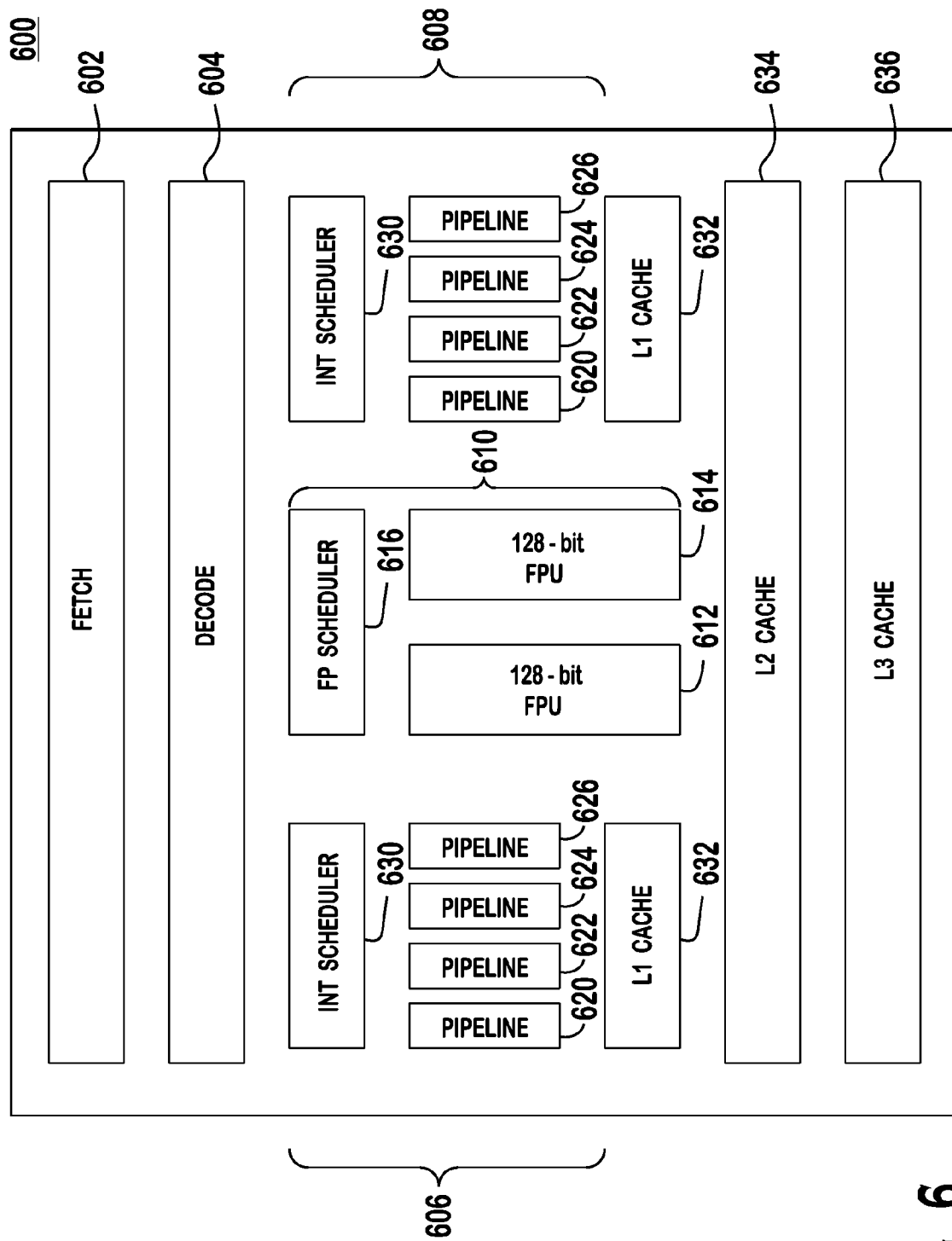
FIG. 6 is a simplified block diagram of a processor core.

FIG. 6 is a simplified block diagram of an exemplary processor core 600 that utilizes the match CAM circuit described herein. The processor core 600 includes an instruction fetch unit 602, an instruction decode unit 604, two integer execution units 606, 608, and a floating point execution unit 610. It should be understood that multiple processor cores may be used in a single processor.

The floating point execution unit 610 includes two 128-bit floating point units (FPU) 612, 614. Each FPU 612, 614 is configured to execute floating point instructions under control of a floating point scheduler 616. Each integer execution unit 606, 608 includes a plurality of pipelines 620, 622, 624, and 626 under control of an integer scheduler 630. The processor core 600 also has L1, L2, and L3 cache memories 632,634,636.

Figure 7:
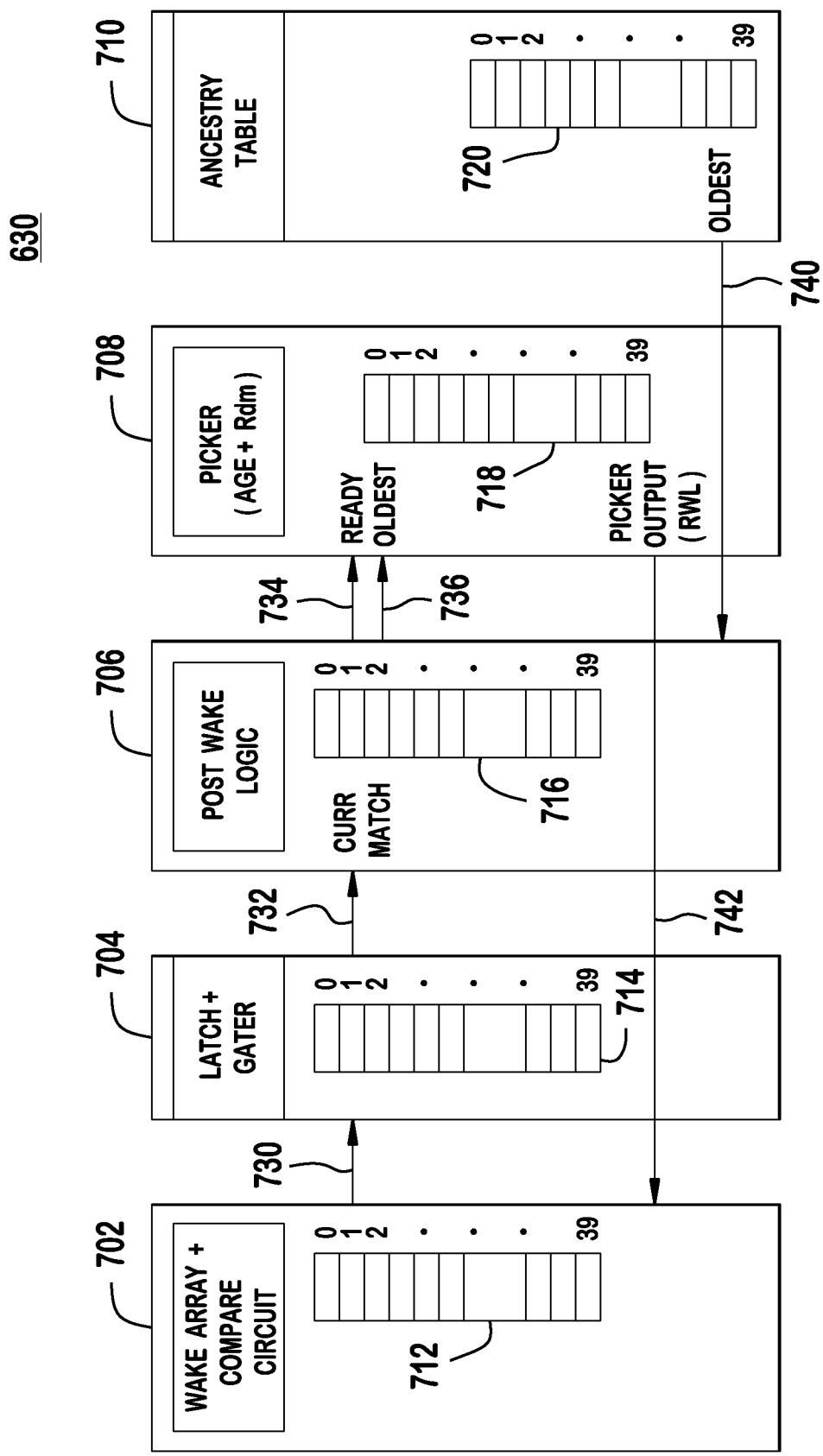
FIG. 7 is a simplified block diagram of an integer scheduler.

FIG. 7 is a simplified block diagram of an integer scheduler 630. It should be understood that the integer scheduler 630 may be used in a variety of processor architectures, and is not limited to use with the processor core disclosed in FIG. 6. It should also be understood that an integer scheduler can perform other functions and may contain additional circuitry beyond what is disclosed herein. In this particular example, the integer scheduler 630 is configured for use with four pipelines, and is referred to as a four-issue integer scheduler. It should be understood that the integer scheduler 630 may be used with any number of pipelines. Accordingly, the disclosure contained herein is applicable to a multi-issue integer scheduler that can be associated with any number of pipelines.

The integer scheduler 630 includes a wake array and compare circuit (wake array logic circuit) 702, a latch and gater circuit (latch circuit) 704, a post wake logic circuit 706, a picker 708, and an ancestry table (age array) 710. The integer scheduler 630 is configured to handle the scheduling of forty instructions (numbered 0-39) as shown schematically by blocks 712-720. Block 712 has forty entries that generally contain vectors associated with forty instructions that are to be scheduled. The remaining blocks 714-720 generally represent read word lines associated with the entries in block 712. Each read word line is assigned a location (0-39) that corresponds to one of the forty vectors in block 712. The read word lines in the integer scheduler 630 are implemented in a fully decoded form (i.e., no decoding is required).

Blocks 702-710 are generally arranged in a circular configuration for continuous operation. As such, the interconnection of blocks 702-710 does not have a specific beginning or end. A description of blocks 702-710 is set out below without regard for the order of the individual blocks. As discussed above, the interconnections between blocks 702-710 may be implemented with multiple read word lines (e.g., one or more read word lines per scheduler entry). Although lines 730-742 are shown as single lines for matters of simplicity, they represent one or multiple read word lines.

The ancestry table 710 tracks which instruction is the oldest and produces an output 740 to identify the oldest instruction. The post wake logic circuit 706 is configured to determine which instructions are ready to be executed, based on the current match input 732 and drives the ready line 734 and the oldest line 736. The picker 708 receives the ready line 734 and the oldest line 736, picks one or more instructions for execution, and drives picker output lines 742.

The wake array logic circuit 702 determines the destination address of the instruction that corresponds to the picked scheduler entry. This destination address is compared to all source addresses (e.g., four sources for each entry in the scheduler 630). The wake array logic circuit 702 identifies a match between any of the source addresses and destination addresses. A match indicates that these sources will be available within a number of clock cycles, since the picked instruction will be executed and the location will have valid data. The wake array logic circuit 702 of completes the loop by driving the current match input 732 via the latch circuit 704. The match CAM circuit described above may be utilized in the wake array logic circuit 702 to identify the match between any of the source addresses and destination addresses.

The post wake logic circuit 706 is configured to determine which instructions are ready. An instruction can be considered "ready" when all necessary resources are available. During instruction execution, typical resources include "source" information (input information) retrieved from a source memory location. Results from instruction execution are stored in a "destination" memory location. A single instruction typically requires one or more sources. A source is considered available if the data at that memory location is speculatively valid.

The post wake logic circuit 706 receives current match input lines 730 from the latch circuit 704. The post wake logic circuit 706 also receives oldest line 740 from the ancestry table circuit 710. Based on these inputs, the post wake logic circuit 706 drives the ready line 734 and the oldest line 736.

The picker 708 receives the ready line 734 and the oldest output line 736 and drives the picker output lines 742. The picker 708 uses two basic criteria for picking an instruction for execution. The picker 708 selects the oldest instruction only if that instruction is ready; otherwise, the picker uses a random function to pick instructions from all available instructions that are ready.

The picker output 742 is supplied to the wake array logic circuit 702. As explained above, the picker output 742 identifies specific scheduler entries that are picked for execution. In one implementation, the picker output 742 is a one-hot vector, with the "1" bit indicating which instruction was picked, identified by a QID (queue identifier) that indicates the picked instruction's position in the vector. The wake array logic circuit 702 receives the picker output 742 and determines the destination address of the instruction that corresponds to the picked scheduler entry. In this example, the destination address is a physical register number (PRN). The destination PRN is compared to all source PRNs, e.g., four sources for each entry in the scheduler 630. The wake array logic circuit 702 identifies a match between any of the source PRNs and the destination PRN, and drives the current match input 732 via the latch circuit 704. The match CAM circuit described above may be utilized in the wake array logic circuit 702 to identify the match between any of the source addresses and destination addresses.

Based on the foregoing description, CAMs may be used in a scheduler, a processor core, or a processor. CAMs may also be used in computer memories (either on the same chip or on a chip separate from the CAM), database engines, data compression hardware, and computer networking devices such as routers or switches.

Although features and elements are described above in particular combinations, each feature or element may be used alone without the other features and elements or in various combinations with or without other features and elements. The methods provided may be implemented in a general purpose computer, a processor or any IC that utilizes CAM arrays. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A content addressable memory (CAM), comprising:
    a plurality of pairs of CAM elements, each pair of CAM elements storing binary values;
    a plurality of sets of decoders, each set of decoders connected to one pair of CAM elements and configured to provide a comparison value;
    a plurality of sets of match lines, each set of match lines configured to provide a match value on only one of the match lines;
    a plurality of sets of comparators, wherein the comparison value is supplied to one of the sets of comparators and the match value is supplied to the one set of comparators, the one set of comparators configured to compare the comparison value to the match value;
    a multiplexor connected to each of the sets of comparators, the multiplexor having two or more input lines and configured to select one of the sets of comparators based on values on the input lines; and
    a single output line connected to each of the comparators, wherein a positive match result value is output on the output line responsive to a comparator indicating a match between the comparison value and the match value.

2. The CAM according to claim 1, wherein one set of decoders is connected to two sets of comparators.

3. The CAM according to claim 1, wherein
    each CAM element has a bit line and a bit bar line configured to hold opposite values that are respectively a first value and a second value dependent on the binary value stored in the CAM element; and
    the bit lines and the bit bar lines of the pair of CAM elements are logically coupled in different combinations to the decoders such that each decoder will have the comparison value only when its respective bit line and bit bar line both hold the first value.

4. The CAM according to claim 1, wherein each decoder includes:
    a logical AND gate; and
    an input inverter coupled to each input of the logical AND gate.

5. The CAM according to claim 1, wherein each comparator includes:
    a logical AND gate;
    an input inverter coupled to each input of the logical AND gate; and
    a n-channel enhancement-type metal-oxide-semiconductor field-effect transistor connected to an output of the logical AND gate.

6. The CAM according to claim 1, wherein each comparator includes:
    two n-channel enhancement-type metal-oxide-semiconductor field-effect transistors in series.

7. A scheduler, comprising:
    a content addressable memory (CAM), including:
        a plurality of pairs of CAM elements, each pair of CAM elements storing binary values;
        a plurality of sets of decoders, each set of decoders connected to one pair of CAM elements and configured to provide a comparison value;
        a plurality of sets of match lines, each set of match lines configured to provide a match value on only one of the match lines;
        a plurality of sets of comparators, wherein the comparison value is supplied to one of the sets of comparators and the match value is supplied to the one set of comparators, the one set of comparators configured to compare the comparison value to the match value;
        a multiplexor connected to each of the sets of comparators, the multiplexor having two or more input lines and configured to select one of the sets of comparators based on values on the input lines; and
        a single output line connected to each of the comparators, wherein a positive match result value is output on the output line responsive to a comparator indicating a match between the comparison value and the match value.

8. A processor core, comprising:
    a content addressable memory (CAM), including:
        a plurality of pairs of CAM elements, each pair of CAM elements storing binary values;
        a plurality of sets of decoders, each set of decoders connected to one pair of CAM elements and configured to provide a comparison value;
        a plurality of sets of match lines, each set of match lines configured to provide a match value on only one of the match lines;
        a plurality of sets of comparators, wherein the comparison value is supplied to one of the sets of comparators and the match value is supplied to the one set of comparators, the one set of comparators configured to compare the comparison value to the match value;
        a multiplexor connected to each of the sets of comparators, the multiplexor having two or more input lines and configured to select one of the sets of comparators based on values on the input lines; and
        a single output line connected to each of the comparators, wherein a positive match result value is output on the output line responsive to a comparator indicating a match between the comparison value and the match value.

9. A processor, comprising:
    a content addressable memory (CAM), including:
        a plurality of pairs of CAM elements, each pair of CAM elements storing binary values;
        a plurality of sets of decoders, each set of decoders connected to one pair of CAM elements and configured to provide a comparison value;

a plurality of sets of match lines, each set of match lines configured to provide a match value on only one of the match lines;

a plurality of sets of comparators, wherein the comparison value is supplied to one of the sets of comparators and the match value is supplied to the one set of comparators, the one set of comparators configured to compare the comparison value to the match value;

a multiplexor connected to each of the sets of comparators, the multiplexor having two or more input lines and configured to select one of the sets of comparators based on values on the input lines; and a single output line connected to each of the comparators, wherein a positive match result value is output on the output line responsive to a comparator indicating a match between the comparison value and the match value.

10. A system, comprising:

a memory; and a content addressable memory (CAM), including:

a plurality of pairs of CAM elements, each pair of CAM elements storing binary values;

a plurality of sets of decoders, each set of decoders connected to one pair of CAM elements and configured to provide a comparison value;

a plurality of sets of match lines, each set of match lines configured to provide a match value on only one of the match lines;

a plurality of sets of comparators, wherein the comparison value is supplied to one of the sets of comparators and the match value is supplied to the one set of comparators, the one set of comparators configured to compare the comparison value to the match value;

a multiplexor connected to each of the sets of comparators, the multiplexor having two or more input lines and configured to select one of the sets of comparators based on values on the input lines; and a single output line connected to each of the comparators, wherein a positive match result value is output on the output line responsive to a comparator indicating a match between the comparison value and the match value.

11. The system according to claim 10, wherein the memory and the CAM are located on a same device.

12. The system according to claim 10, wherein the memory and the CAM are located on separate devices.

* * * * *